United States Patent
Lee et al.

(10) Patent No.: US 7,704,681 B2
(45) Date of Patent: Apr. 27, 2010

(54) MANUFACTURING METHOD FOR PIXEL STRUCTURE

(75) Inventors: Yi-Wei Lee, Taoyuan (TW); Ching-Yun Chu, Taoyuan (TW)

(73) Assignee: Au Optronics Corp., Hsinchu (TW)

( * ) Notice: Subject to any disclaimer, the term of this patent is extended or adjusted under 35 U.S.C. 154(b) by 988 days.

(21) Appl. No.: 11/453,162

(22) Filed: Jun. 13, 2006

(65) Prior Publication Data

US 2007/0190466 A1    Aug. 16, 2007

(30) Foreign Application Priority Data

Feb. 15, 2006   (TW) ............... 95105007 A

(51) Int. Cl.
*G03F 1/00*   (2006.01)
*G02F 1/1343*   (2006.01)
(52) U.S. Cl. .................. 430/320; 430/323; 349/143
(58) Field of Classification Search ............ 430/320, 430/323; 349/143
See application file for complete search history.

(56) References Cited

U.S. PATENT DOCUMENTS

| 5,610,082 A | 3/1997 | Oh ............... 438/160 |
| 6,297,862 B1 | 10/2001 | Murade ............ 394/44 |
| 6,537,840 B2 | 3/2003 | Tseng ............ 438/30 |

*Primary Examiner*—Thorl Chea
(74) *Attorney, Agent, or Firm*—J.C. Patents

(57) ABSTRACT

A manufacturing method for a pixel structure is provided. The method includes the following steps. A first photomask is used to form a source/drain on a substrate. A second photomask is used twice to form a transparent conductive layer and a channel layer on the substrate respectively. The transparent conductive layer covers a portion of the source/drain and is electrically connected with the same, and the pattern of the transparent conductive layer and the pattern of the channel layer are complementary patterns. Then, a dielectric layer is formed over the substrate to cover the transparent conductive layer and the channel layer. A third photomask is used to form a gate on the dielectric layer.

10 Claims, 15 Drawing Sheets

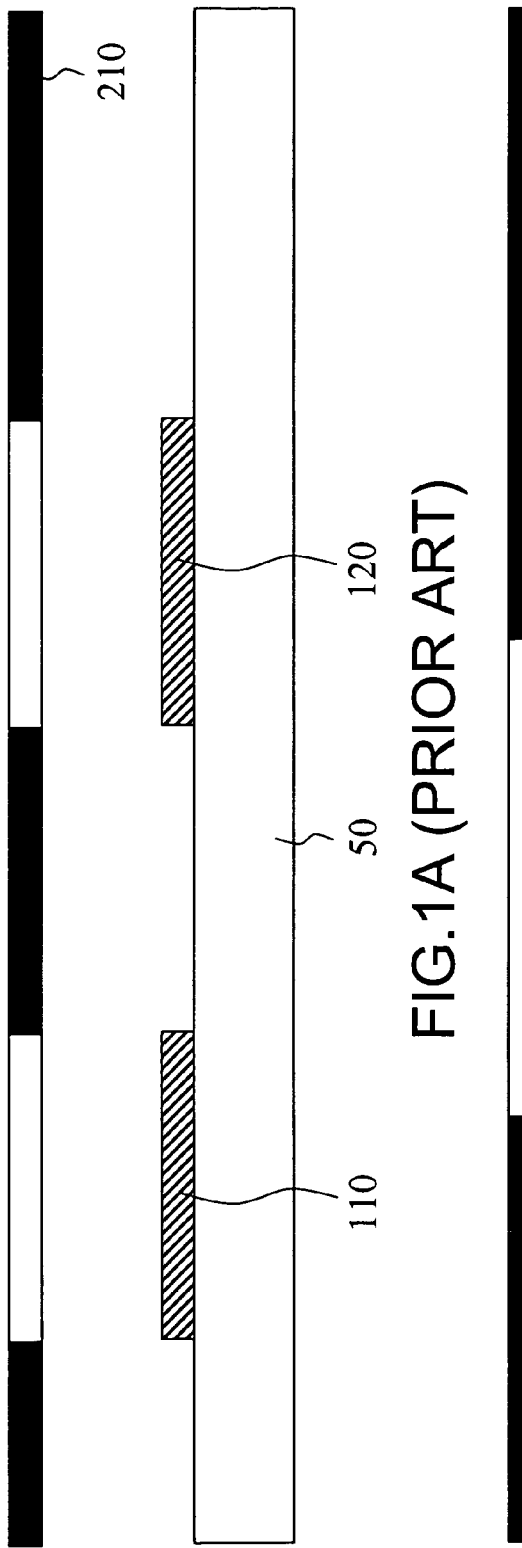
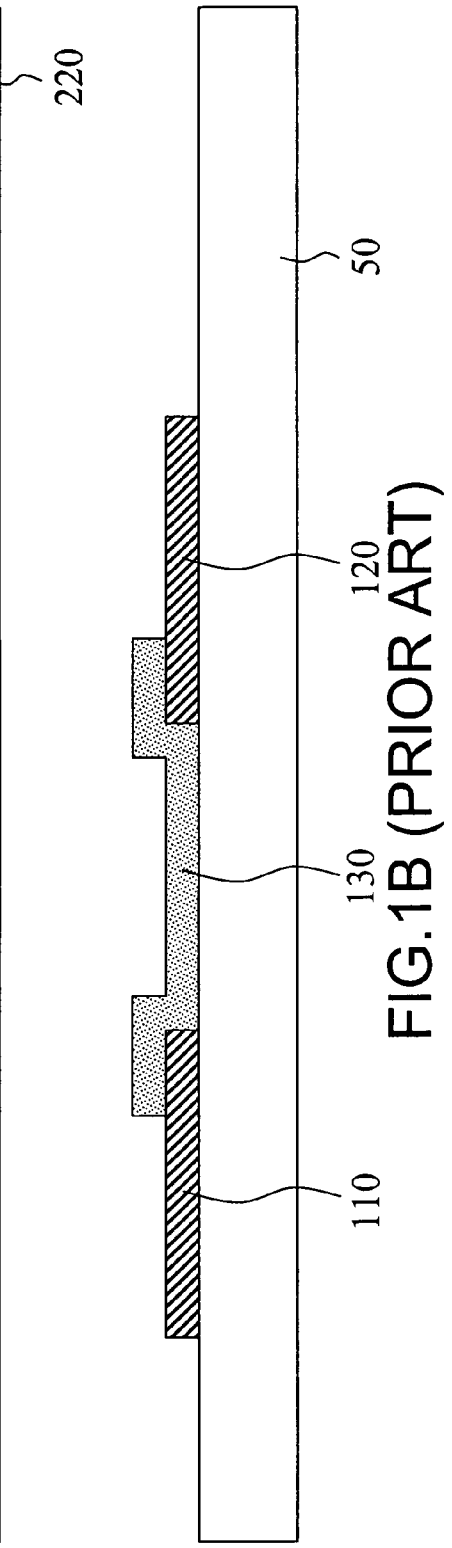
FIG.1A (PRIOR ART)
FIG.1B (PRIOR ART)

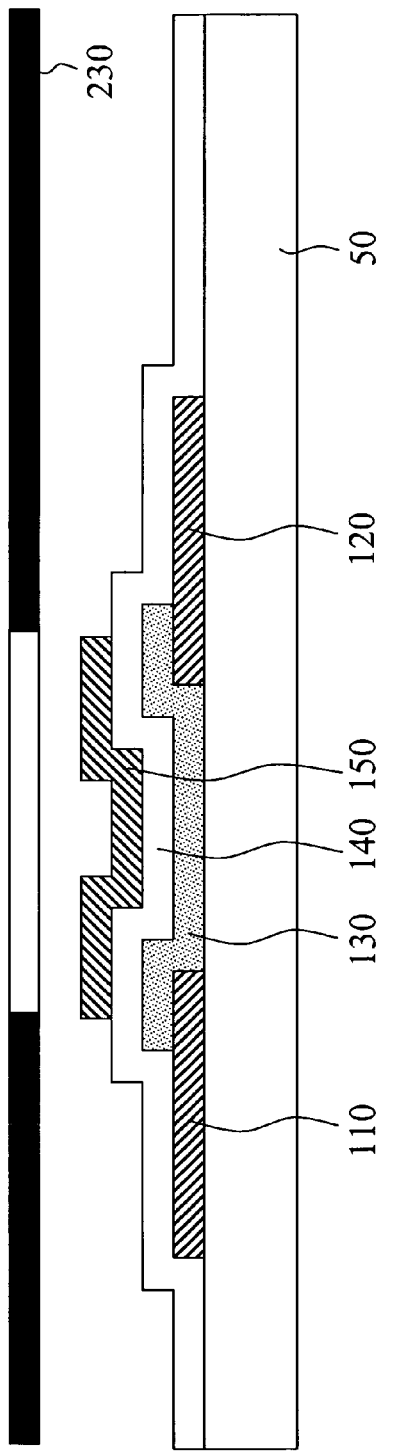
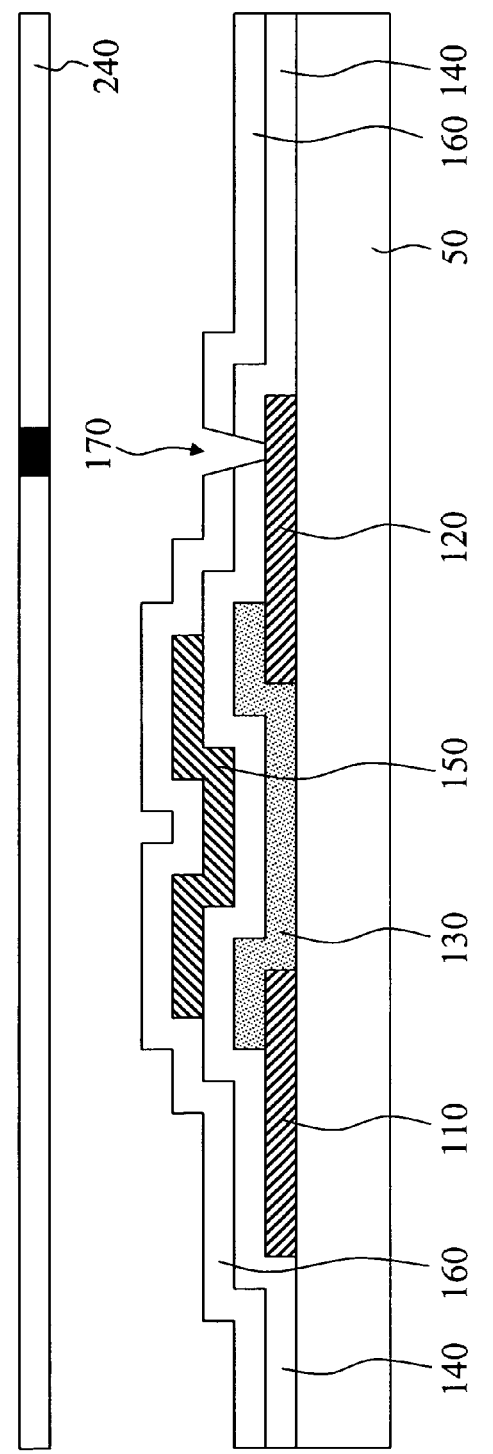
FIG.1C (PRIOR ART)
FIG.1D (PRIOR ART)

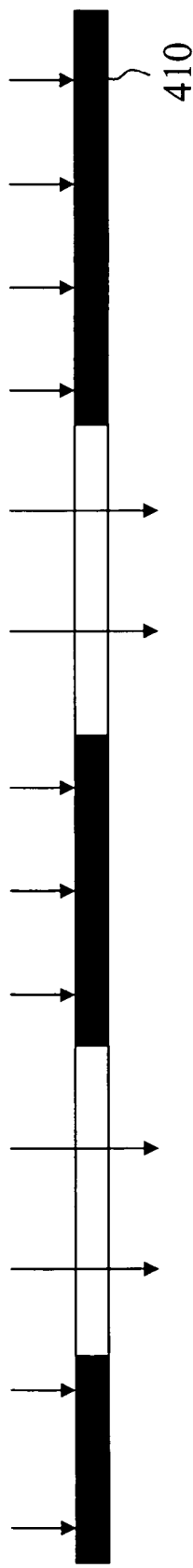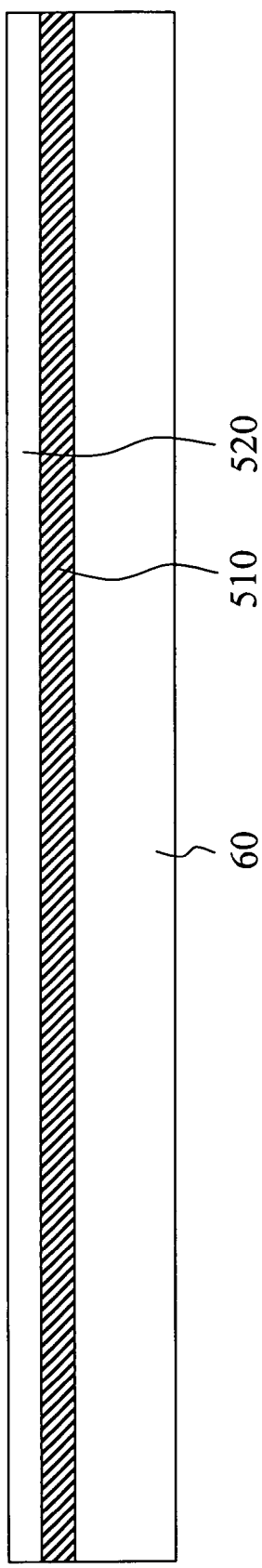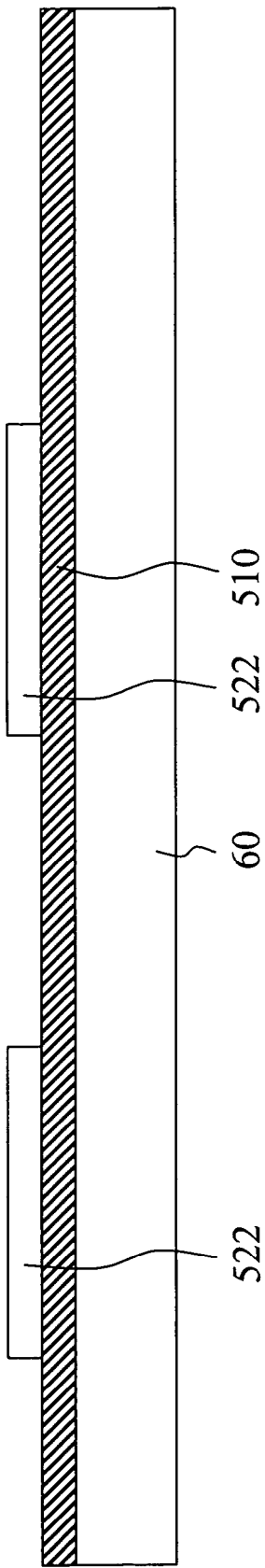
FIG.2A  FIG.2B

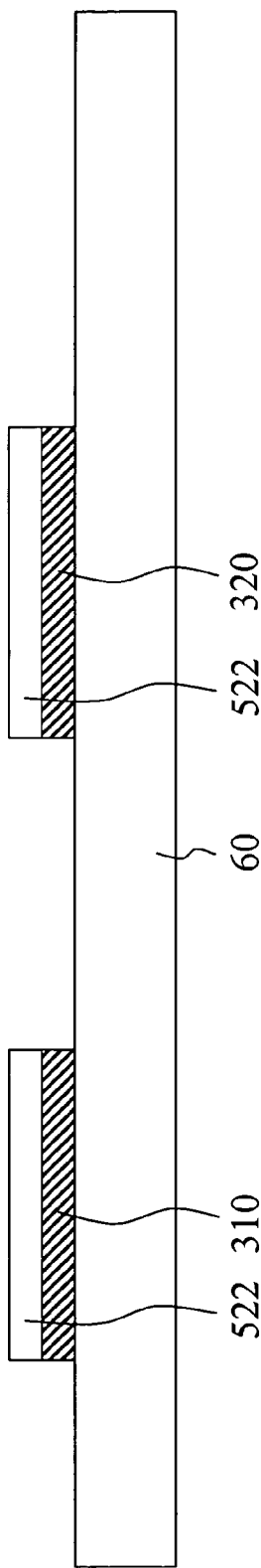
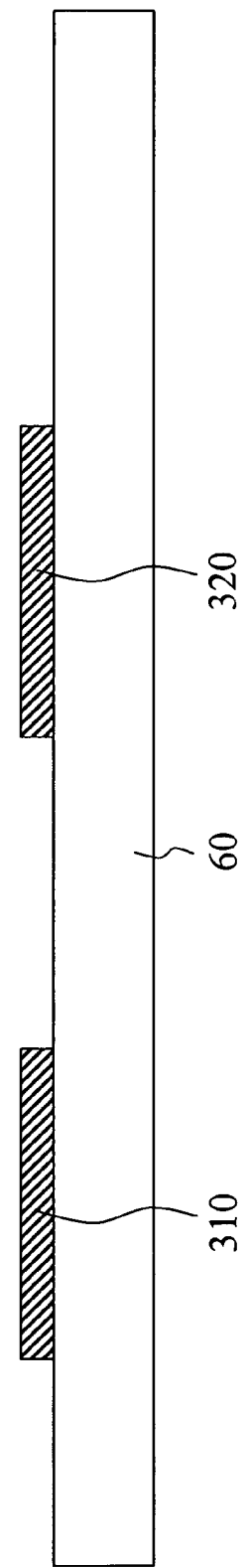
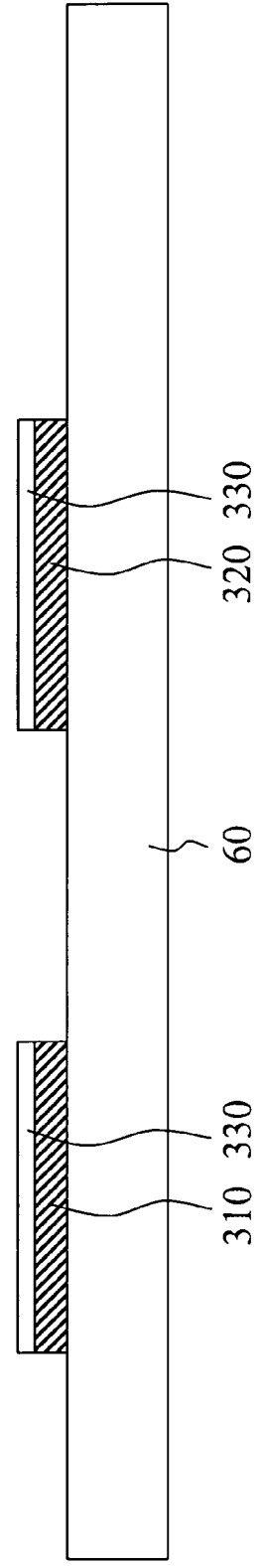

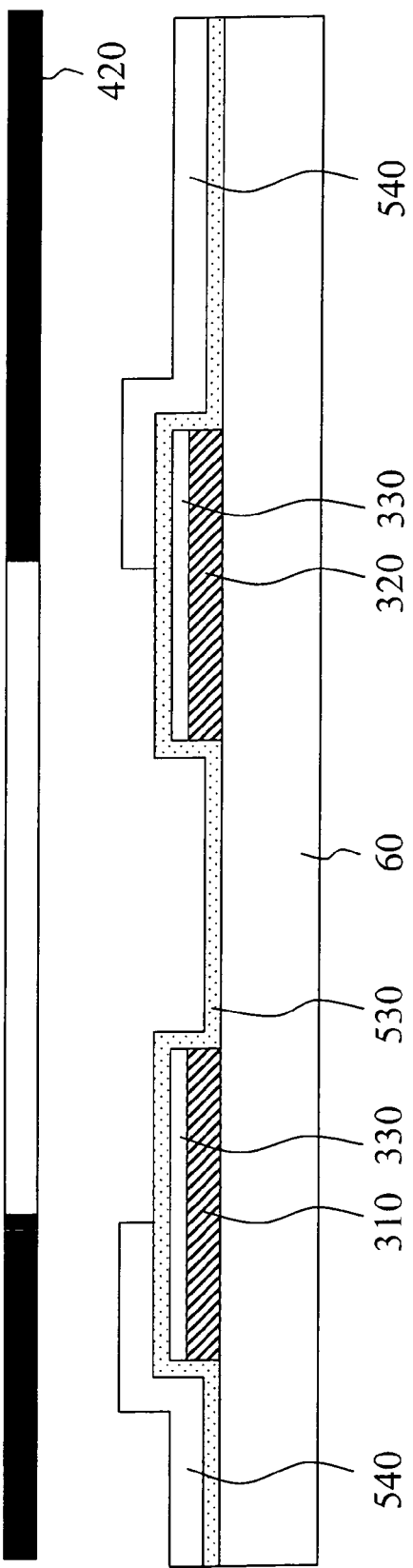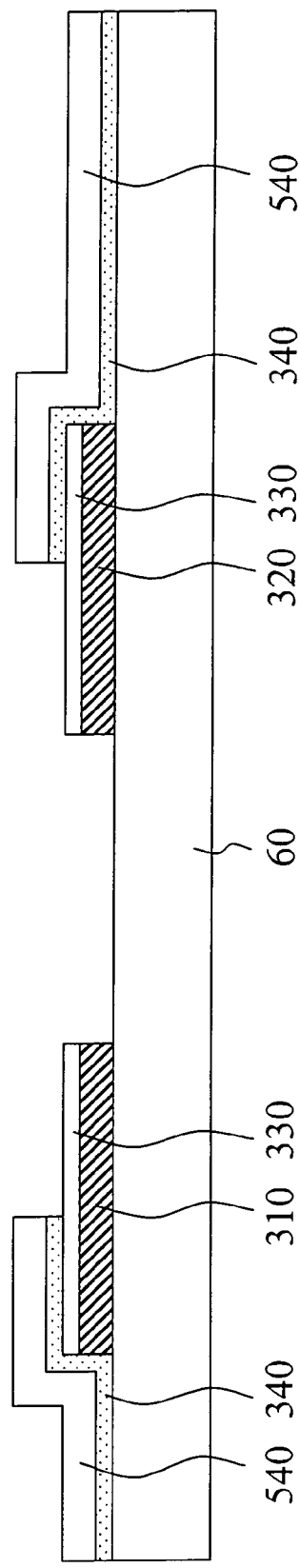
FIG.2F
FIG.2G

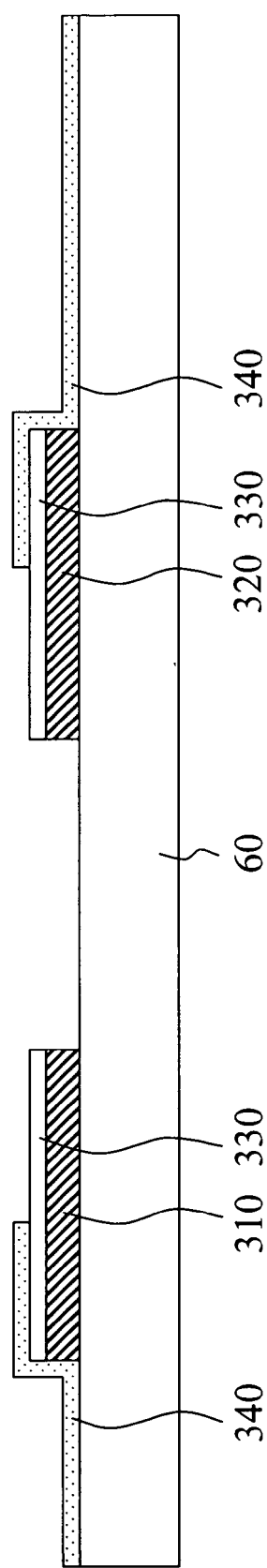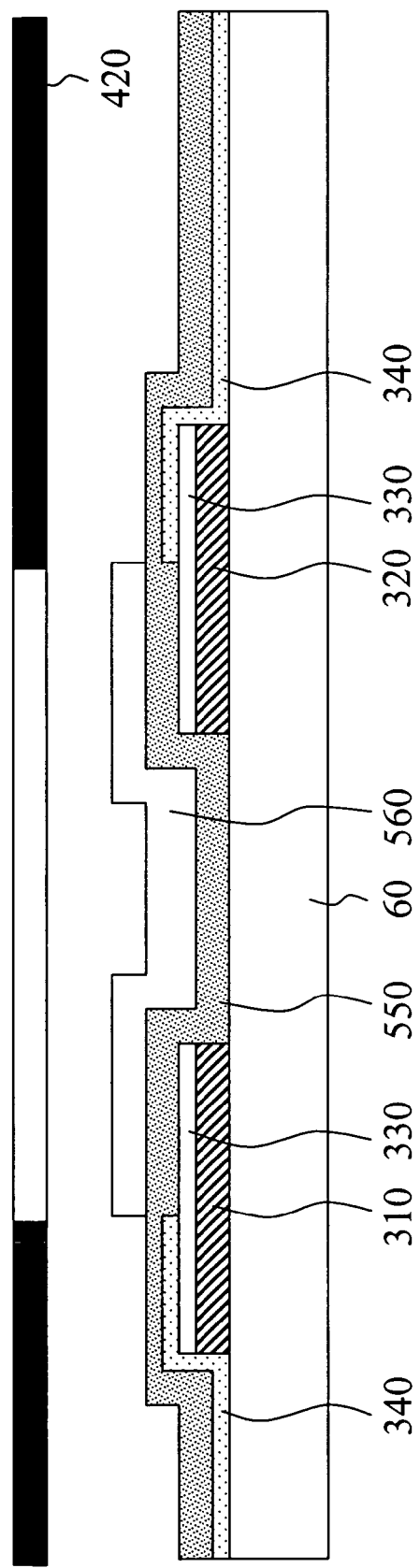

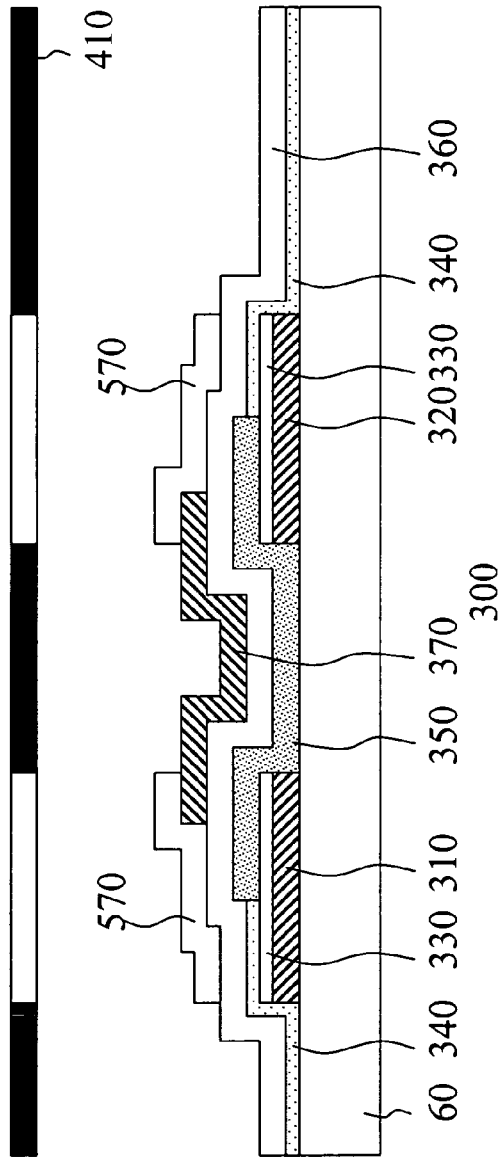
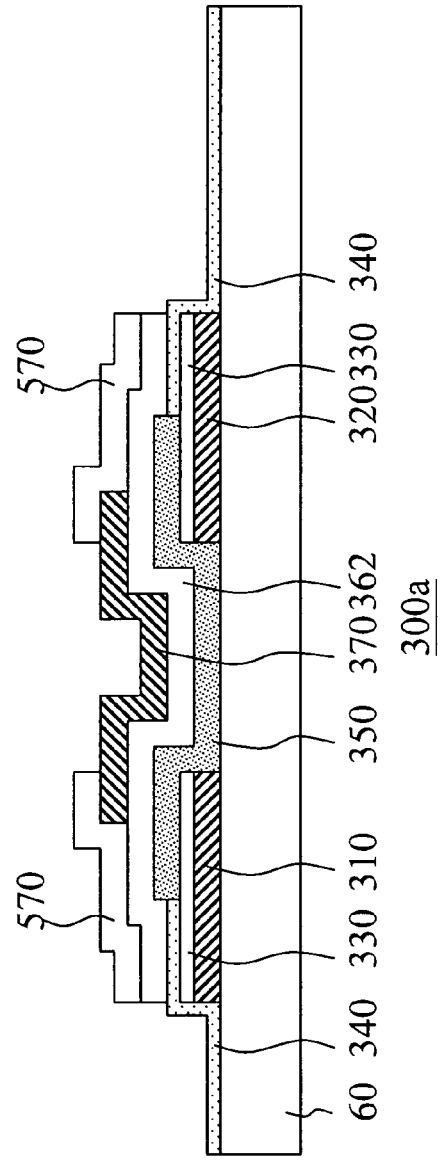
FIG.3A
FIG.3B

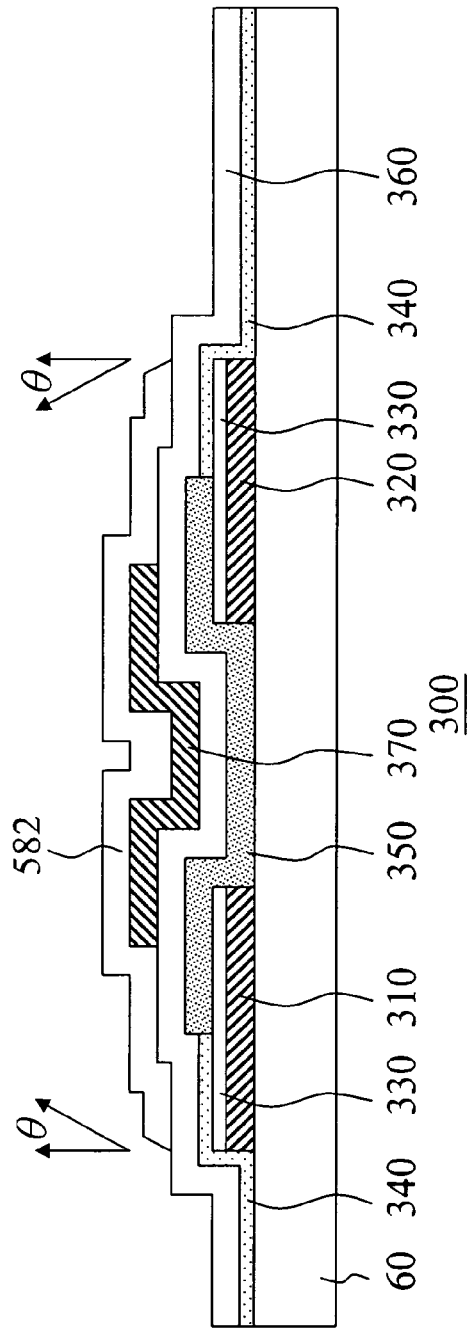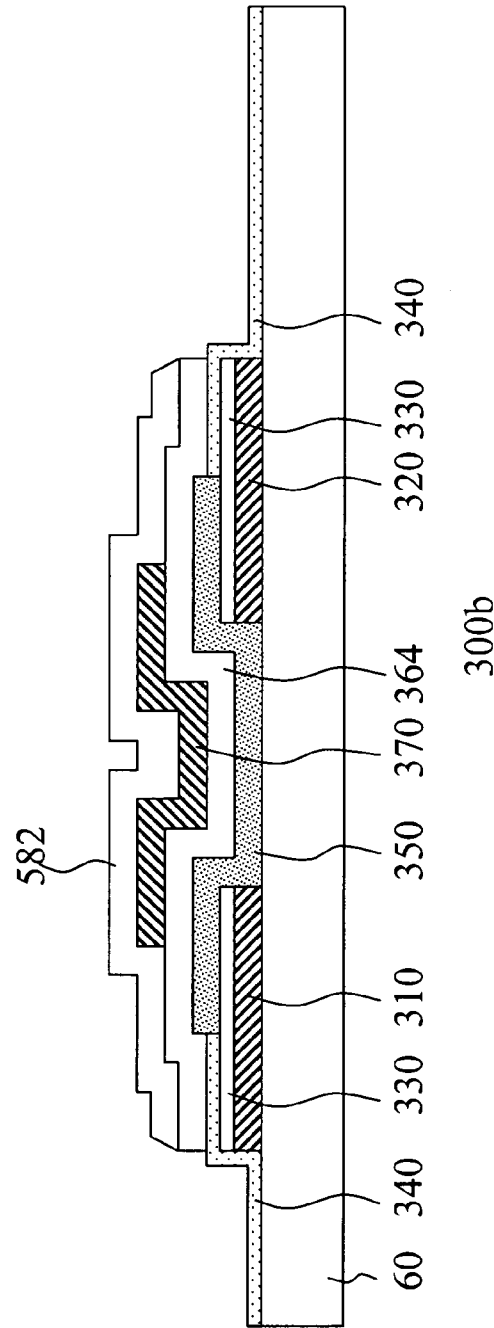

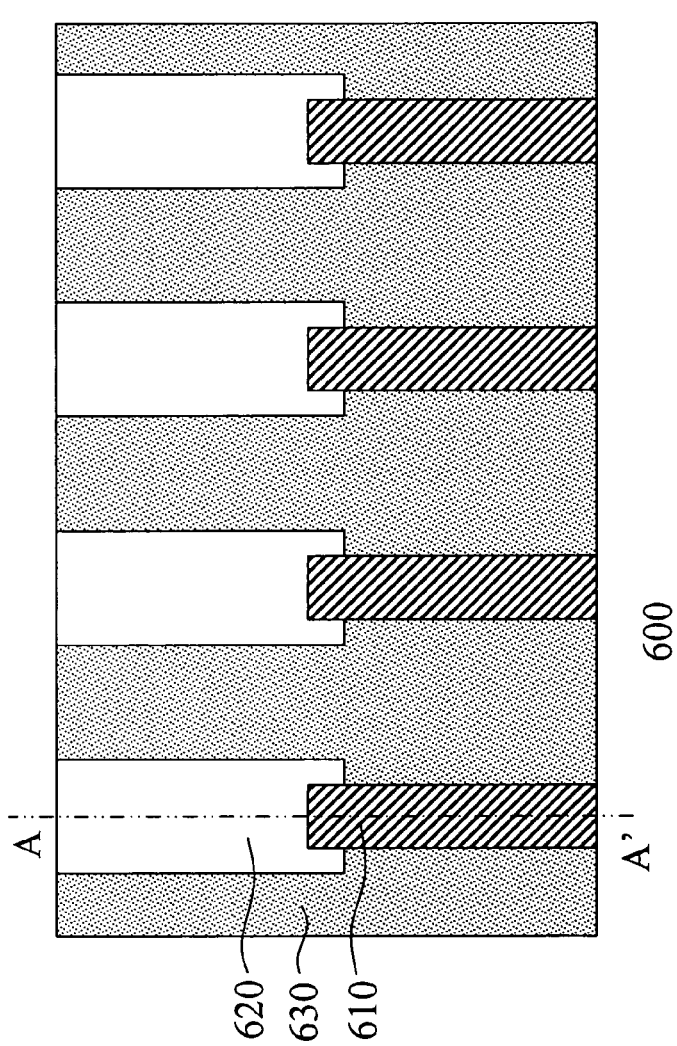
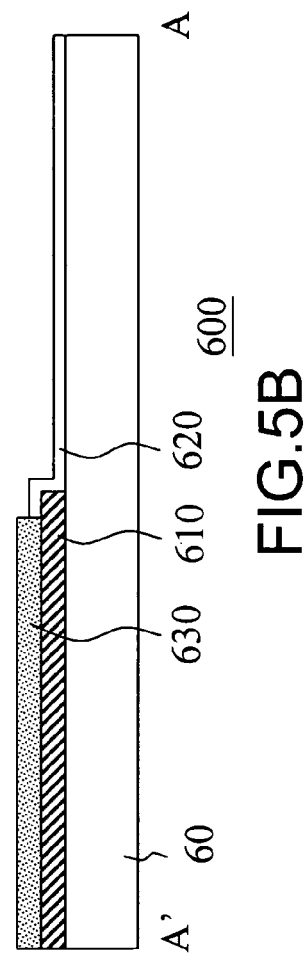
FIG.5A
FIG.5B

MANUFACTURING METHOD FOR PIXEL STRUCTURE

CROSS-REFERENCE TO RELATED APPLICATION

This application claims the priority benefit of Taiwan application serial no. 95105007, filed on Feb. 15, 2006. All disclosure of the Taiwan application is incorporated herein by reference.

BACKGROUND OF THE INVENTION

1. Field of the Invention

The present invention relates to a manufacturing method for a semiconductor device. More particularly, the present invention relates to a manufacturing method for a pixel structure.

2. Description of the Related Art

Accompanied by the significant progress in video communication technologies, a large number of different display devices have been used as display screens in all sorts of consumer electronic products including mobile phones, notebook computers, digital cameras and personal digital assistants. Today, liquid crystal display (LCD) and organic light-emitting diode (OLED) display have become the two most popular mainstream products among various types of display devices because of their light weight, streamlined body and their low power consumption. The method of manufacturing the liquid crystal display or the organic light-emitting diode (OLED) display includes forming a pixel array on a substrate in a semiconductor process. By adjusting the display color of various pixels in the pixel array, the display device can produce colorful and high-quality pictures.

FIGS. 1A through 1E are schematic cross-sectional views showing the steps for manufacturing a conventional pixel structure. As shown in FIG. 1A, a first photomask 210 is used to form a source 110 and a drain 120 on a substrate 50. Then, as shown in FIG. 1B, a second photomask 220 is used to form a channel layer 130 on the substrate 50 and a portion of the source 110 and the drain 120. As shown in FIG. 1C, a first dielectric layer 140 is formed over the substrate 50 to cover the source 110, the drain 120 and the channel layer 130. Then, using a third mask 230, a gate 150 is formed on the first dielectric layer 140. As shown in FIG. 1D, a second dielectric layer 160 is formed on the first dielectric layer 140 and the gate 150. After that, a fourth photomask 240 is used to form a contact window 170 that exposes a portion of the drain 120 in the first dielectric layer 140 and the second dielectric layer 160. As shown in FIG. 1E, a fifth photomask 250 is used to form a transparent conductive layer 180 over the second dielectric layer 160. A portion of the transparent conductive layer 180 fills the contact window 170 so that the transparent conductive layer 180 is electrically connected to the drain 120. Up to this step, the process of fabricating the pixel structure 100 is completed.

Accordingly, the main cost for producing the pixel structure 100 lies in the fabrication of photomasks. In the conventional technique, five different photomasks are used in the process of manufacturing the pixel structure 100 so that the production cost can hardly be reduced. Furthermore, as the size of the substrate increases to accommodate more devices, a larger size photomask must be deployed to form the pixel structure 100. Ultimately, the cost of producing the pixel structure 100 will increase even further.

SUMMARY OF THE INVENTION

Accordingly, at least one objective of the present invention is to provide a method for manufacturing a pixel structure capable of lowering the production cost.

To achieve this and other advantages and in accordance with the purpose of the invention, as embodied and broadly described herein, the invention provides a method for manufacturing a pixel structure. The method includes the steps of: using a first photomask to form a third patterned photoresist layer, and using the third patterned photoresist layer as a mask to form a source/drain on a substrate; using a second photomask to form a first patterned photoresist layer, using the first patterned photoresist layer as a mask to form a transparent conductive layer, using the same second photomask to form a second patterned photoresist layer, and using the second patterned photoresist layer as a mask to form a channel layer over the substrate such that the transparent conductive layer covers a portion of the source/drain and electrically connected to the same, and furthermore, a pattern of the transparent conductive layer and a pattern of the channel layer are complementary patterns; forming a dielectric layer over the substrate to cover the transparent conductive layer and the channel layer; and, using a third photomask to form a fourth patterned photoresist layer, and using the fourth patterned photoresist layer as a mask to form a gate on the dielectric layer.

In one embodiment of the present invention, the steps of using the second photomask to form the transparent conductive layer and using the same second photomask to form the channel layer over the substrate comprises forming a transparent conductive material layer over the substrate to cover the source/drain; using the second photomask to form the first patterned photoresist layer on the transparent conductive material layer; using the first patterned photoresist layer as a mask to remove a portion of the transparent conductive layer and form the transparent layer; removing the first patterned photoresist layer; forming a channel material layer over the substrate; using the second photomask to form the second patterned photoresist layer over the channel material layer such that the second patterned photoresist layer and the first patterned photoresist layer are different types; using the second patterned photoresist layer as a mask to remove a portion of the channel material layer and form the channel layer; and, removing the second patterned photoresist layer.

In one embodiment of the present invention, the first patterned photoresist layer is fabricated from positive photoresist and the second atterned photoresist layer is fabricated from negative photoresist.

In one embodiment of the present invention, the first patterned photoresist layer is fabricated from negative photoresist and the second patterned photoresist layer is fabricated from positive photoresist.

In one embodiment of the present invention, the step of using the second photomask to form the transparent conductive layer and using the same second photomask to form the channel layer over the substrate comprises forming a channel material layer over the substrate to cover the source/drain; using the second photomask to form the second patterned photoresist layer over the channel material layer; using the second patterned photoresist layer as a mask to remove a portion of the channel material layer and form the channel layer; removing the second patterned photoresist layer; forming a transparent conductive material layer over the substrate; using the second photomask to form the first patterned photoresist layer on the transparent conductive material layer such that the first patterned photoresist layer and the second patterned photoresist layer are different types; using the first patterned photoresist layer as a mask to remove a portion of the transparent conductive material layer and form the transparent layer; and, removing the first patterned photoresist layer.

In one embodiment of the present invention, the first patterned photoresist layer is fabricated from positive photoresist and the second patterned photoresist layer is fabricated from negative photoresist.

In one embodiment of the present invention, the first patterned photoresist layer is fabricated from negative photoresist and the second patterned photoresist layer is fabricated from positive photoresist.

In one embodiment of the present invention, after the step of forming the source/drain, further includes using the first photomask to form an ohmic contact layer over the source/drain.

In one embodiment of the present invention, after the step of forming the gate, further includes using the first photomask to form a patterned photoresist layer over the dielectric layer and the gate; using the patterned photoresist layer as a mask to remove a portion of the dielectric layer and form a patterned dielectric layer such that the patterned dielectric layer exposes a portion of the transparent conductive layer; and removing the patterned photoresist layer.

In one embodiment of the present invention, after the step of forming the gate, further includes forming a photoresist layer over the dielectric layer and the gate where the gate and the source/drain are partially overlapped; using the source/drain and the gate as a mask to pattern the photomask layer and form a patterned photomask layer; using the patterned photomask layer as a mask to remove a portion of the dielectric layer and form a patterned dielectric layer such that the patterned dielectric layer exposes a portion of the transparent conductive layer; and removing the patterned photoresist layer.

In brief, compared with the conventional technique having to use five photomasks to fabricate the pixel structure, only three photomasks are required in the present invention. Therefore, the overall production cost can be reduced substantially.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIGS. 1A through 1E are schematic cross-sectional views showing the steps in a conventional method for fabricating a pixel structure.

FIGS. 2A through 2M are schematic cross-sectional views showing the steps for fabricating a pixel structure according to one embodiment of the present invention.

FIGS. 3A through 3C are schematic cross-sectional views showing the steps for removing a dielectric layer according to one embodiment of the present invention.

FIGS. 4A through 4D are schematic cross-sectional views showing the steps for removing a dielectric layer according to another embodiment of the present invention.

FIG. 5A is a diagram showing a terminal structure according to one embodiment of the present invention.

FIG. 5B is a cross-sectional view along line A-A' of FIG. 5A.

DESCRIPTION OF THE PREFERRED EMBODIMENTS

Figure 1E:
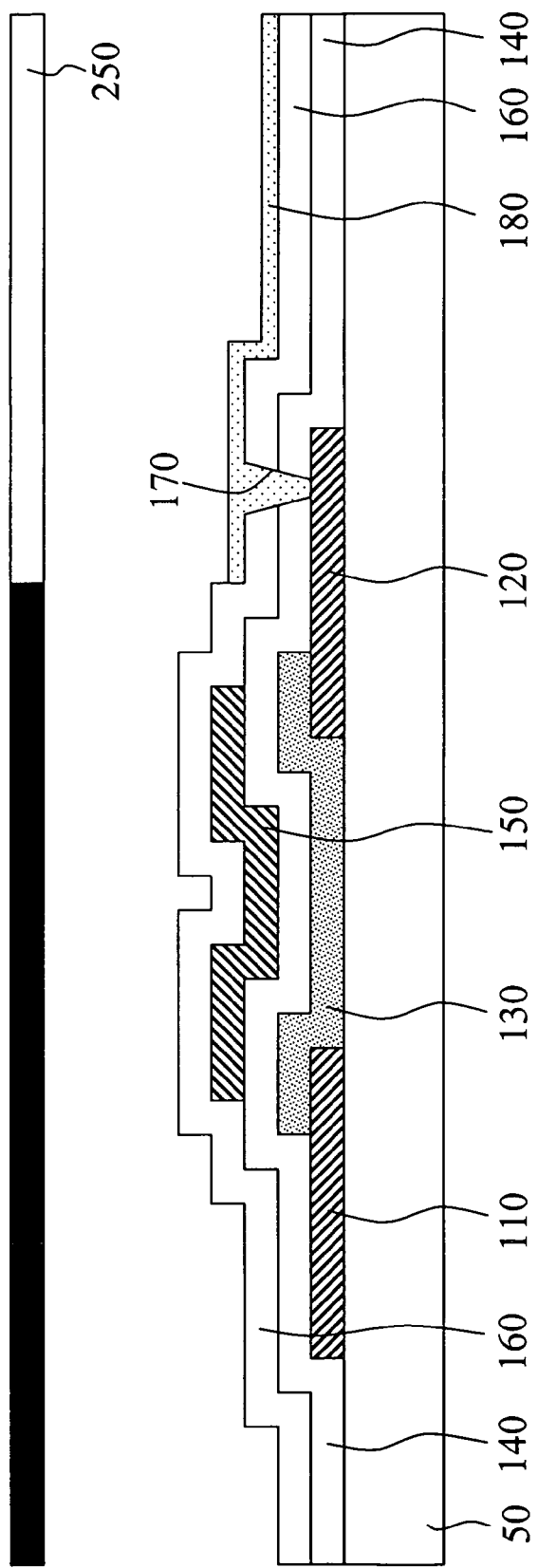

Reference will now be made in detail to the present preferred embodiments of the invention, examples of which are illustrated in the accompanying drawings. Wherever possible, the same reference numbers are used in the drawings and the description to refer to the same or like parts.

Figure 2J:
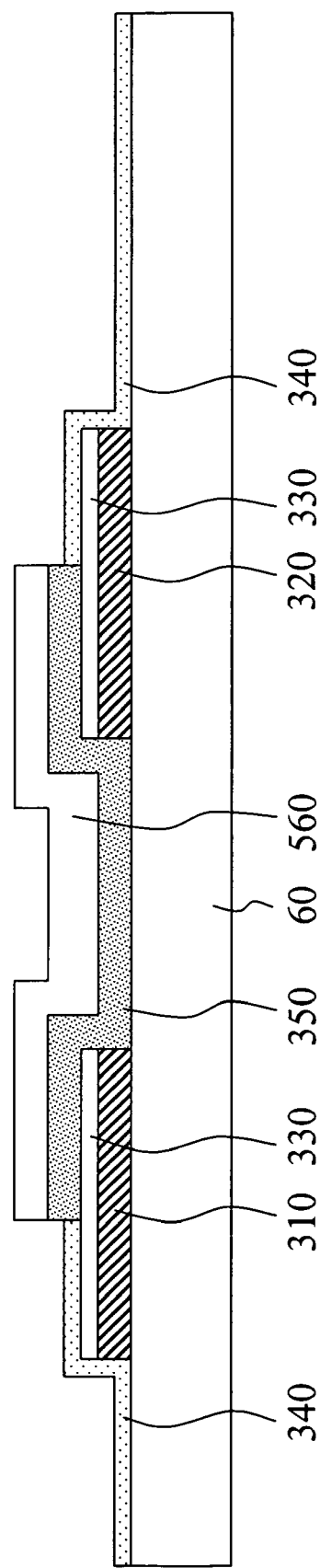

FIGS. 2A through 2M are schematic cross-sectional views showing the steps for fabricating a pixel structure according to one embodiment of the present invention. As shown in FIG. 2A, a conductive layer 510 is formed over a substrate 60. The conductive layer 510 can be fabricated using a material selected from a group consisting of aluminum (Al), molybdenum (Mo), molybdenum nitride (MoN), titanium (Ti), titanium nitride (TiN), chromium (Cr), chromium nitride (CrN) or combinations of the above. In the present embodiment, the conductive layer 510 can be a titanium/aluminum/titanium nitride three-layered stacked structure with the aluminum preferably having a thickness between 500 Å~2000 Å, and the titanium or the titanium nitride layer having a thickness between 300 Å~1000 Å. Then, a photoresist layer 520 is formed over the conductive layer 510. Afterwards, a first photomask 410 is used as a mask to photo-expose the photoresist layer 520.

As shown in FIG. 2B, the photoresist layer 520 is developed to form a patterned photoresist layer 522. In the present embodiment, the photoresist layer 520 can be a negative photoresist layer so that the exposed portion of the photoresist layer 520 will not be removed after the development process. Then, using the patterned photoresist layer 522 as an etching mask as shown in FIG. 2C, an etching process is performed to remove a portion of the conductive layer 510 and form a source 310 and a drain 320. Thereafter, as shown in FIG. 2D, a stripping process is performed to remove the patterned photoresist layer 522. Hence, the steps for forming the source 310 and the drain 320 on the substrate 60 using the first photomask 410 are completed (FIGS. 2A~2D).

To enhance the electrical properties of the source 310 and the drain 320, an ohmic contact layer 330 is formed over the source 310 and the drain 320 using the first photomask 410 as shown in FIG. 2E. Since the steps for forming the ohmic contact layer 330 is very similar to the foregoing method, a detailed description is omitted. In the present embodiment, the ohmic contact layer 330 can be a heavily doped amorphous silicon layer (n+α-Si) with a preferred thickness between 500 Å~4000 Å. Furthermore, other processes can be also used to form the ohmic contact layer 330 in the present invention. For example, after forming the conductive layer 150 (as shown in FIG. 2A), an ohmic contact material layer (not shown) is formed over the conductive layer 510. Then, a photoresist layer 520 is formed over the ohmic contact material layer. Afterwards, exposure process and development process for the photoresist layer 520 are carried out in sequence to form a patterned photoresist layer 522. After that, an etching process is performed to remove a portion of the conductive layer 510 and form a source 310 and a drain 320. Finally, a stripping process is carried out to remove the patterned photoresist layer 522 (as shown in FIG. 2E).

As shown in FIG. 2F, a transparent conductive material layer 530 is formed over the substrate 60 to cover the source 310 and the drain 320. The transparent conductive material layer 530 is fabricated using indium tin oxide (ITO) or indium zinc oxide (IZO) and has a preferred thickness of between 500 .ANG.about.3000 .ANG. Then, using a second photomask 420, a first type patterned photoresist layer 540 is formed over the transparent conductive material layer 530. The first type patterned photoresist layer 540 can be a positive photoresist layer. Thereafter, as shown in FIG. 2G, using the first type patterned photoresist layer 540 as a mask, a portion of the transparent conductive material layer 530 is removed to form a transparent conductive layer 430. The transparent conductive layer 340 covers a portion of the source 310 and the drain 320 and is electrically connected to the same. Next, as shown in FIG. 2H, a stripping process is carried out to remove the first type patterned photoresist layer 540, thereby completing the steps for forming the transparent conductive layer 340 over the substrate 60 using the second photomask 420 (as shown in FIGS. 2F.about.2H).

Figure 2K:
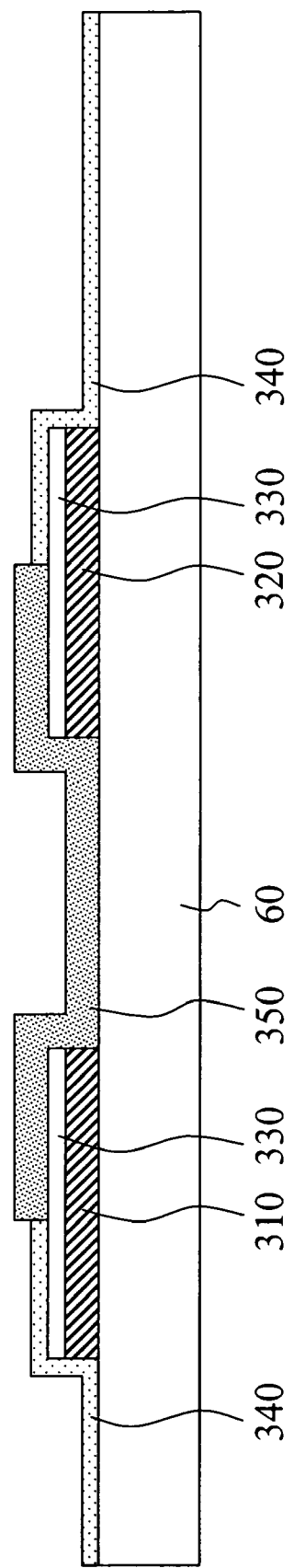

As shown in FIG. 2I, a channel material layer 550 is formed over the substrate 60 to cover the source 310, the drain 320 and the transparent conductive layer is 340. The channel layer 550 can be an amorphous silicon (α-Si) layer with a preferred thickness of between 500 Å~4000 Å. Then, using the second photomask 420, a second type patterned photoresist layer 560 is formed over the channel material layer 550. The second type patterned photoresist layer 560 can be a negative photoresist layer. Thereafter, as shown in FIG. 2J, using the second type patterned photoresist layer 560 as a mask, a portion of the conductive material layer 550 is removed to form a channel layer 350. The channel layer 350 covers a portion of the source 310 and the drain 320. Furthermore, the pattern of the channel layer 350 and the pattern of the transparent conductive layer 340 are complementary patterns. Next, as shown in FIG. 2K, a stripping process is carried out to remove the second type patterned photoresist layer 560, thereby completing the steps for forming the channel layer 350 over the substrate 60 using the second photomask 420 (as shown in FIGS. 2I~2K).

In the present invention, the sequence for fabricating the transparent conductive layer 340 and the channel layer 350 is not fixed. In other words, the steps as shown in FIGS. 2I~2K for forming the channel layer 350 can be carried out first followed by the steps as shown in FIGS. 2F~2H for forming the transparent conductive layer 340. In addition, the first type patterned photoresist layer 540 and the second type patterned photoresist layer 560 can be exchanged. That is, the first type patterned photoresist layer 540 can be a negative photoresist layer while the second type patterned photoresist layer 560 can be a positive photoresist layer. Obviously, in the present embodiment, the transparent and non-transparent regions in the second photomask 420 must be adjusted accordingly. Since anyone familiar with the technique can provide a suitable arrangement, a detailed description of the steps is omitted.

Figure 2L:
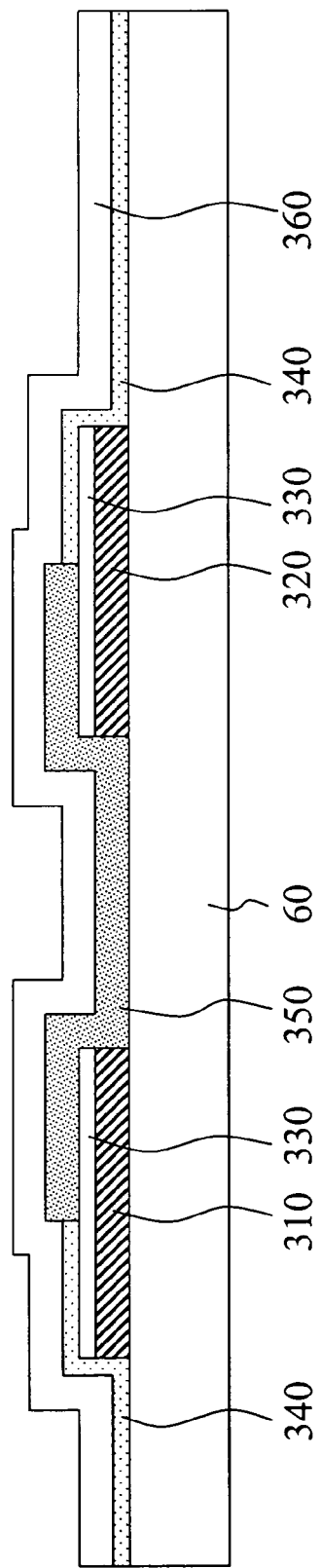

As shown in FIG. 2L, a dielectric layer 360 is formed over the substrate 60. The dielectric layer 360 is fabricated using silicon nitride ($SiN_x$), silicon oxide ($SiO_x$) or silicon oxynitride ($SiO_xN_y$). Moreover, the dielectric layer 360 preferably has a thickness between 1500 Å~4000 Å and is formed in a plasma-enhanced chemical vapor deposition (PECVD) process with a growing temperature preferably not exceeding 300° C.

Figure 2M:
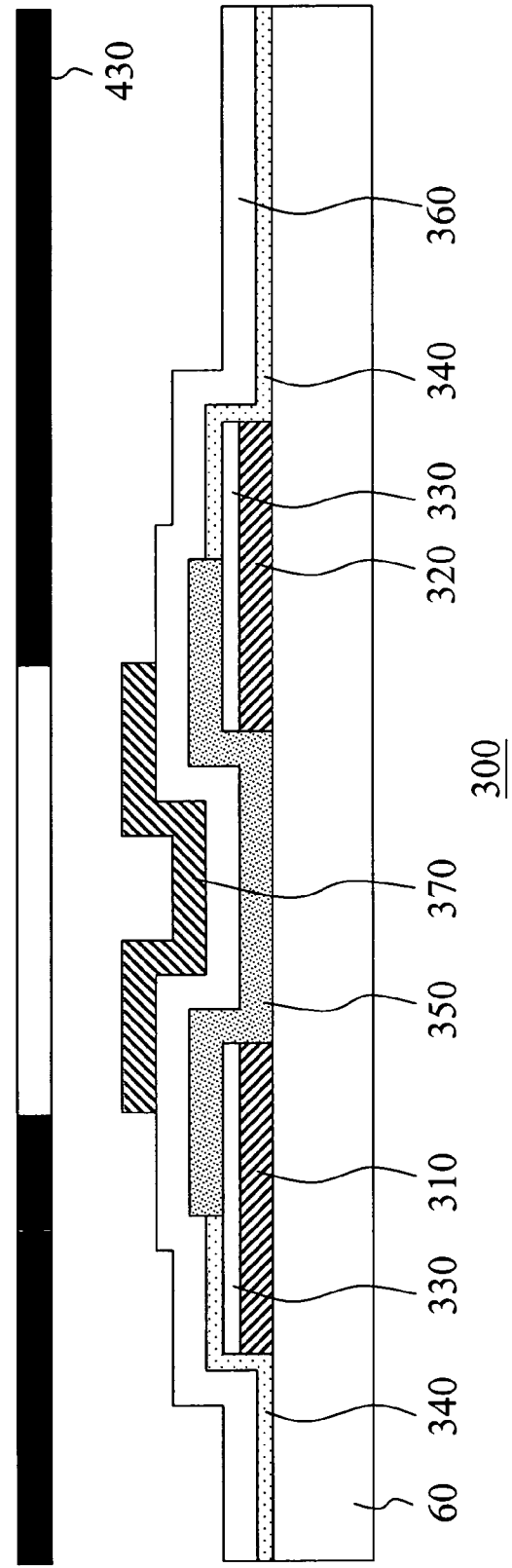

As shown in FIG. 2M, a third photomask 430 is used to form a gate 370 over the dielectric layer 360. Since the steps for forming the gate 370 over the dielectric layer 360 is similar to the steps shown in FIGS. 2A~2D, a detailed description in not repeated here. The gate 370 is fabricated using a material selected from a group consisting of aluminum, molybdenum, molybdenum nitride, titanium, titanium nitride, chromium, chromium nitride or combinations of the above. In the present embodiment, the gate 370 can also be a titanium nitride/aluminum/titanium/titanium nitride four-layered stacked structure. The aluminum layer preferably has a thickness between 500 Å~2000 Å and the titanium or titanium nitride layer preferably has a thickness between 300 Å~1000 Å.

After completing the foregoing steps, the pixel structure 30 of the present invention is fully formed. Because the present invention uses only three photomasks including the first photomask 410, the second photomask 420 and the third photomask 430 to form the pixel structure 300, considerable production cost is saved. Moreover, in the present invention, the second photomask 420 is used twice to perform a photolithographic process on positive and negative photoresist for forming the transparent conductive layer 340 and the channel layer 350 respectively. Hence, the required number of photomask is reduced.

Figure 3C:
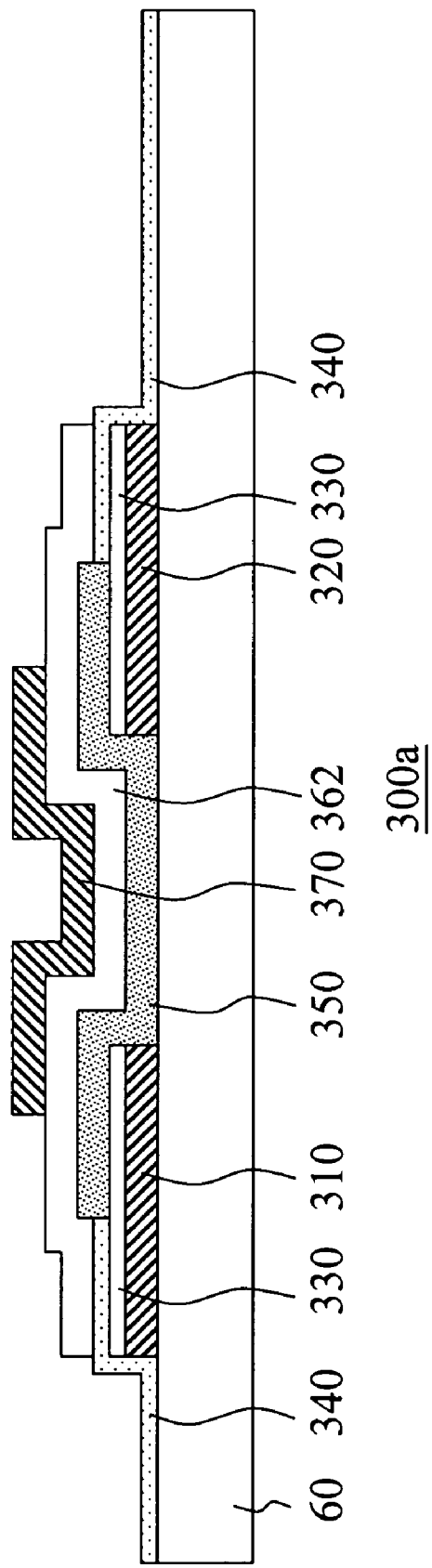

To provide the pixel structure 300 with a better transparency effect, a portion of the dielectric layer 360 above the transparent conductive layer 340 can be removed. FIGS. 3A through 3C are schematic cross-sectional views showing the steps for removing a dielectric layer according to one embodiment of the present invention. FIG. 3A is a continuation of the flow from FIG. 2M. As shown in FIG. 3A, the first photomask 410 is used to form a patterned photoresist layer 570 over the dielectric layer 360 and the gate 370. As shown in FIG. 3B, using the patterned photoresist layer 570 as a mask, an etching process is performed to remove a portion of the dielectric layer 360 and form a patterned dielectric layer 362. The patterned dielectric layer 362 exposes a portion of the transparent conductive layer 340.

In the foregoing etching process of the present embodiment, a dry etching process with a high selectivity ratio can be used to prevent the gate 370 from being removed in the etching process. More specifically, the gaseous etchant can be a group comprising sulfur hexafluoride ($SiF_6$)/carbon tetrafluoride ($CF_4$)/nitrogen ($N_2$)/oxygen ($O_2$). Furthermore, when the processing pressure is between 1~5 mTorr, the etching selectivity ratio between the dielectric layer 360 and the gate 370 is between 2.0~3.0 to ensure the etching process will not damage the gate structure 370. As shown in FIG. 3C, a stripping process is carried out to remove the patterned photoresist layer 570, thereby completing the steps for forming a patterned dielectric layer 362 on the pixel structure 300a (as shown in FIGS. 3A~C).

The foregoing process of removing the dielectric layer 360 is achieved using the first photomask 410 together with an etching process with a high selectivity ratio. Since there is no need to use additional photomask, the cost of producing the pixel structure 300a can be reduced. Moreover, the present invention does not limit the removal of the dielectric layer 360 above a portion of the transparent conductive layer 340 to the foregoing method. Another method of removing the dielectric layer is provided in the following embodiment.

Figure 4A:
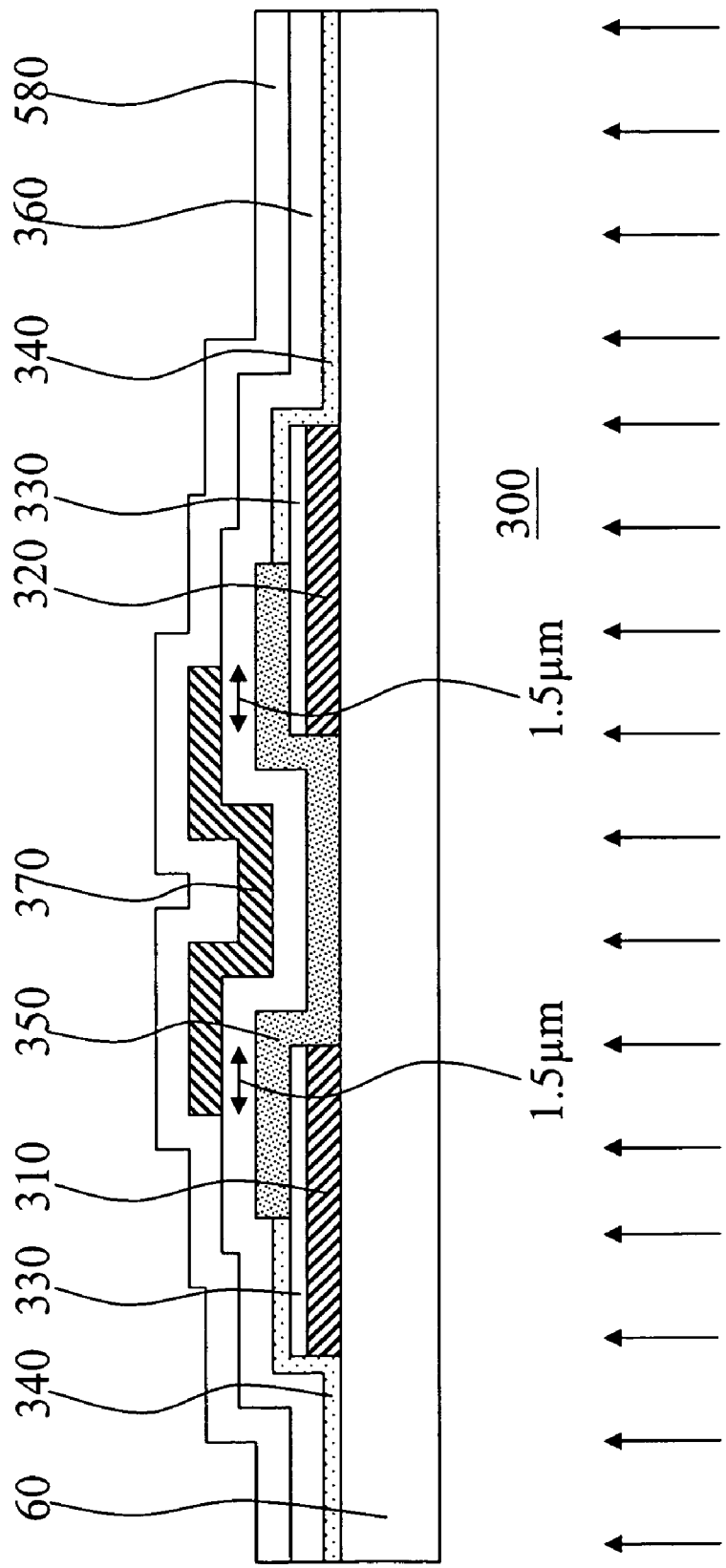

FIGS. 4A through 4D are schematic cross-sectional views showing the steps for removing a dielectric layer according to another embodiment of the present invention. FIG. 4A is a continuation of the step in FIG. 2M. As shown in FIG. 4A, a photoresist layer 580 is formed over the dielectric layer 360 and the gate 370. Then, using the source 310, the drain 320 and the gate 270 as a mask, the photoresist layer 580 is photo-exposed from the bottom of the substrate 60. This processing technique is often referred to as back light exposure technology. To improve the expose quality and effect, the photo-expose light source in the present embodiment preferably has a wavelength between 100~450 nm. Furthermore, the corresponding photoresist layer 580 is fabricated using a highly sensitive photoresist. In addition, the bottommost layer of the source 310, the drain 320 and the gate 370 can be fabricated using titanium nitride. The titanium nitride layer serves as an anti-reflection layer to reduce the standing wave phenomena in the photo-expose process and improve the exposure effect. The source 310 and the drain 320 may overlap partially with the gate 370 and the overlapping range between the two is preferably about 1.5 μm.

Figure 4D:
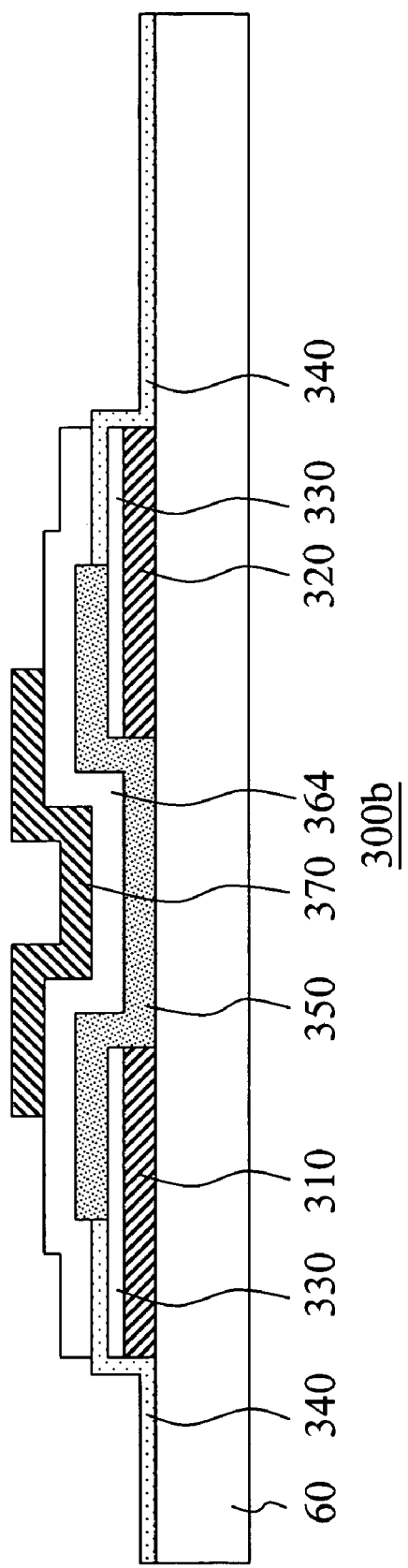

As shown in FIG. 4B, the photoresist layer 580 is developed to form a patterned photoresist layer 582. In the present embodiment, the photoresist layer 580 is a positive photoresist so that the portion of the photoresist layer 580 not exposed to light will not be removed after the development process. In addition, the angle of formation θ of the patterned photoresist layer 582 is preferably between the range 45°~80°. Then, as shown in FIG. 4C, using the patterned photoresist layer 582 as a mask, an etching process is performed to remove a portion of the dielectric layer 360 and form a patterned dielectric layer 364. The patterned dielectric layer 364 exposes a portion of the transparent conductive layer 340. Next, as shown in FIG. 4D, a stripping process is carried out to remove the patterned photoresist layer 582, thereby completing the steps for forming the patterned dielectric layer 364 on the pixel structure 300b (as shown in FIGS. 4A~4D).

In the foregoing process of removing the dielectric layer 360, the source 310, the drain 320 and the gate 370 are used as mask in a back exposure process. Since there is no need for an additional photomask, the production cost of the pixel structure 300b can be reduced. Moreover, the method of using just three photomasks can be used to form a terminal structure. The terminal structure is explained in more detail in the following.

FIG. 5A is a diagram showing a terminal structure according to one embodiment of the present invention. FIG. 5B is a cross-sectional view along line A-A' of FIG. 5A. As shown in FIGS. 5A and 5B, the terminal structure 600 in the present invention mainly comprises a conductive wire 610, a transparent conductive wire 620 and an amorphous silicon layer 630. The conductive wire 610 and the transparent conductive line 620 are electrically connected and suitable for transmitting electrical signals. The conductive line 610 can be fabricated in the same process for forming the source 310 and the drain 320 (as shown in FIGS. 2A~2D). The transparent conductive line 620 can be fabricated in the same process for forming the transparent conductive layer 340 (as shown in FIGS. 2F~2H. The amorphous silicon layer 630 can be fabricated in the same process for forming the channel layer 350 (as shown in FIG. 2I~2K).

In summary, the method for manufacturing a pixel structure in the present invention has at least the following advantages:

1. Compared with the conventional technique of using five photomasks to fabricate the pixel structure, only three photomasks are used in the present invention. Hence, the production cost of the pixel structure can be significantly reduced.

2. The method of fabricating the pixel structure in the present invention is compatible to the existing manufacturing processes so that no additional equipment needs to be secured.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method for a pixel structure, comprising the steps of:
    using a first photomask to form a third patterned photoresist layer, and using the third patterned photoresist layer as a mask to form a source/drain over a substrate;
    using a second photomask to form a first patterned photoresist layer, using the first patterned photoresist layer as a mask to form a transparent conductive layer, using the same second photomask to form a second patterned photoresist layer, and using the second patterned photoresist layer as a mask to form a channel layer over the substrate, wherein a portion of the transparent conductive layer covers the source/drain and electrically connected to the same, and a pattern of the transparent conductive layer and a pattern of the channel layer are complementary patterns;
    forming a dielectric layer over the substrate to cover the transparent conductive layer and the channel layer; and
    using a third photomask to form a fourth patterned photoresist layer, and using the fourth patterned photoresist layer as a mask to form a gate on the dielectric layer.

2. The method of claim 1, wherein the steps of using the second photomask to form the transparent conductive layer and using the same second photomask to form the channel layer over the substrate comprises:
    forming a transparent conductive material layer over the substrate to cover the source/drain;
    using the second photomask to form the first patterned photoresist layer over the transparent conductive material layer;
    using the first patterned photoresist layer as a mask to remove a portion of the transparent conductive material layer and form a transparent conductive layer;
    removing the first patterned photoresist layer;
    forming a channel material layer over the substrate;
    using the second photomask to form the second patterned photoresist layer over the channel material layer, wherein the first patterned photoresist layer and the second patterned photoresist layer are different types;
    using the second patterned photoresist layer as a mask to remove a portion of the channel material layer and form the channel layer; and
    removing the second patterned photoresist layer.

3. The method of claim 2, wherein the first patterned photoresist layer is a positive photoresist and the second patterned photoresist layer is a negative photoresist.

4. The method of claim 2, wherein the first patterned photoresist layer is a negative photoresist and the second patterned photoresist layer is a positive photoresist.

5. The method of claim 1, wherein the steps of using the second photomask to form the transparent conductive layer and using the same second photomask to form the channel layer over the substrate comprises:
    forming a channel material layer over the substrate to cover the source/drain;
    using the second photomask to form the second patterned photoresist layer over the channel material layer;
    using the second patterned photoresist layer as a mask to remove a portion of the channel material layer and form the channel layer;

removing the second patterned photoresist layer;

forming a transparent conductive material layer over the substrate;

using the second photomask to form the first patterned photoresist layer over the transparent conductive material layer, wherein the first patterned photoresist layer and the second patterned photoresist layer are different types;

using the first patterned photoresist layer as a mask to remove a portion of the transparent conductive material layer and form a transparent conductive layer; and removing the first patterned photoresist layer.

6. The method of claim 5, wherein the first patterned photoresist layer is a positive photoresist and the second patterned photoresist layer is a negative photoresist.

7. The method of claim 5, wherein the first patterned photoresist layer is a negative photoresist and the second patterned photoresist layer is a positive photoresist.

8. The method of claim 1 further comprises using the first photomask to form an ohmic contact layer over the source/drain after the step of forming the source/drain.

9. The method of claim 1, after forming the gate, further comprising:

using the first photomask to form a patterned photoresist layer over the dielectric layer and the gate;

using the patterned photoresist layer as a mask to remove a portion of the dielectric layer and form a patterned dielectric layer, wherein the patterned dielectric layer exposes a portion of the transparent conductive layer; and removing the patterned photoresist layer.

10. The method of claim 1, wherein after forming the gate, further comprises:

forming a photoresist layer over the dielectric layer and the gate, wherein the gate and the source/drain overlap partially;

using the source/drain and the gate as a mask to pattern the photoresist layer and form a patterned photoresist layer;

using the patterned photoresist layer as a mask to remove a portion of the dielectric layer and form a patterned dielectric layer, wherein the patterned dielectric layer exposes a portion of the transparent conductive layer; and removing the patterned photoresist layer.

* * * * *